United States Patent
Kang et al.

(10) Patent No.: US 9,806,296 B2
(45) Date of Patent: Oct. 31, 2017

(54) ORGANIC LIGHT EMITTING DIODE DEVICE

(71) Applicant: SAMSUNG DISPLAY CO., LTD., Yongin, Gyeonggi-Do (KR)

(72) Inventors: Namsu Kang, Seoul (KR); Jihye Shim, Yongin-si (KR); Jihwan Yoon, Yongin-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/789,652

(22) Filed: Jul. 1, 2015

(65) Prior Publication Data

US 2016/0118628 A1    Apr. 28, 2016

(30) Foreign Application Priority Data

Oct. 24, 2014  (KR) ........................ 10-2014-0145343

(51) Int. Cl.
| | | |
|---|---|---|
| H01L 29/08 | (2006.01) |
| H01L 29/04 | (2006.01) |
| H01L 27/15 | (2006.01) |
| H01L 33/00 | (2010.01) |
| H01L 51/52 | (2006.01) |
| H01L 51/50 | (2006.01) |

(52) U.S. Cl.
CPC ........ *H01L 51/5275* (2013.01); *H01L 51/524* (2013.01); *H01L 51/5012* (2013.01); *H01L 2251/558* (2013.01)

(58) Field of Classification Search
CPC ............. H01L 51/5275; H01L 51/5012; H01L 51/5203; H01L 51/524; H01L 2251/558

USPC ......... 257/40, 59, 72, E33.069, E51.018, 43, 257/79, 98, 100, E51.022; 438/42
See application file for complete search history.

(56) References Cited

U.S. PATENT DOCUMENTS

| | | | |
|---|---|---|---|
| 2003/0194484 A1* | 10/2003 | Yamazaki | ............... C23C 14/24 427/66 |
| 2005/0146267 A1* | 7/2005 | Lee | ........................... B05D 1/60 313/506 |
| 2005/0287688 A1* | 12/2005 | Won | ....................... C23C 16/345 438/22 |
| 2006/0097264 A1 | 5/2006 | Kim et al. | |
| 2007/0194679 A1 | 8/2007 | Jo et al. | |
| 2008/0018230 A1* | 1/2008 | Yamada | .................. B32B 27/00 313/498 |
| 2008/0203908 A1* | 8/2008 | Hasegawa | ........... H01L 51/5265 313/504 |

(Continued)

FOREIGN PATENT DOCUMENTS

| | | |
|---|---|---|
| KR | 10-2001-0091666 A | 10/2001 |
| KR | 10-2005-0095099 A | 9/2005 |

(Continued)

*Primary Examiner* — Dzung Tran
(74) *Attorney, Agent, or Firm* — Lee & Morse, P.C.

(57) ABSTRACT

An organic light emitting diode device includes: a first substrate; a first electrode on the first substrate; an organic light emitting layer on the first electrode; a second electrode on the organic light emitting layer; and a capping layer on the second electrode. The capping layer may include at least one high refractive-index layer and at least two low refractive-index layers having thicknesses different from each other.

17 Claims, 5 Drawing Sheets

(56) References Cited

U.S. PATENT DOCUMENTS

| | | | |
|---|---|---|---|
| 2008/0296600 A1* | 12/2008 | Kwack | ............... H01L 51/5265 257/98 |
| 2009/0102362 A1 | 4/2009 | Lee et al. | |
| 2010/0237333 A1 | 9/2010 | Thomschke et al. | |
| 2010/0320446 A1 | 12/2010 | Kang et al. | |
| 2011/0042702 A1 | 2/2011 | Lim et al. | |
| 2011/0121271 A1 | 5/2011 | Jeon et al. | |
| 2011/0140164 A1* | 6/2011 | Seo | .................... H01L 51/5256 257/100 |
| 2013/0181193 A1 | 7/2013 | Moon | |

FOREIGN PATENT DOCUMENTS

| | | |
|---|---|---|
| KR | 10-2006-0042728 A | 5/2006 |
| KR | 10-2007-0084940 A | 8/2007 |
| KR | 10-2008-0073256 A | 8/2008 |
| KR | 10-2009-0039065 A | 4/2009 |
| KR | 10-2010-0036331 A | 4/2010 |
| KR | 10-2011-0019195 A | 2/2011 |
| KR | 10-2011-0058126 A | 6/2011 |
| KR | 10-1268534 B1 | 5/2013 |
| WO | WO 2011/055440 A1 | 5/2011 |

* cited by examiner

ORGANIC LIGHT EMITTING DIODE DEVICE

CROSS-REFERENCE TO RELATED APPLICATION

Korean Patent Application No. 10-2014-0145343, filed on Oct. 24, 2014, in the Korean Intellectual Property Office, and entitled: "Organic Light Emitting Diode Device," is incorporated by reference herein in its entirety.

BACKGROUND

1. Field

Embodiments relate to an organic light emitting diode device improved in light efficiency and color distortion phenomenon.

2. Description of the Related Art

An organic light emitting diode device is a self-emission type display device that displays an image with an organic light emitting diode (OLED) that emits light. The organic light emitting diode device may not require a separate light source, unlike a liquid crystal display (LCD), and, thus, may have relatively reduced thickness and weight. Further, the organic light emitting diode device may exhibit excellent properties, e.g., low power consumption, high luminance, and high speed of response, and, thus, has drawn attention as a display device of the next generation.

The OLED may generally include a hole injection electrode, an organic light emitting layer, and an electron injection electrode. A hole injected from the hole injection electrode and an electron injected from the electron injection electrode are combined with each other to form an exciton. The OLED emits light by energy generated when the exciton falls from an excited state to a ground state.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

According to one or more embodiments, an organic light emitting diode device includes a first substrate; a first electrode on the first substrate; an organic light emitting layer on the first electrode; a second electrode on the organic light emitting layer; and a capping layer on the second electrode. The capping layer may include at least one high refractive-index layer and at least two low refractive-index layers having thicknesses different from each other.

The capping layer may include a first high refractive-index layer, a first low refractive-index layer, and a second low refractive-index layer.

The first low refractive-index layer, the first high refractive-index layer, and the second low refractive-index layer may be sequentially stacked on the second electrode.

The first low refractive-index layer may have a thickness greater than that of the second low refractive-index layer.

The first high refractive-index layer may have a refractive index of about 1.8 to 2.5, and the first low refractive-index layer and the second low refractive-index layer have a refractive index of about 1.3 to 1.75.

The first high refractive-index layer may have a thickness of about 10 to 100 nm, and the first low refractive-index layer and the second low refractive-index layer have a thickness of about 5 to 30 nm.

The capping layer may include a first high refractive-index layer, a second high refractive-index layer, a first low refractive-index layer, a second low refractive-index layer, and a third low refractive-index layer.

The first low refractive-index layer, the first high refractive-index layer, the second low refractive-index layer, the second high refractive-index layer, and the third low refractive-index layer may be sequentially stacked on the second electrode.

The first low refractive-index layer may have a thickness greater than those of the second low refractive-index layer and the third low refractive-index layer, and the second low refractive-index layer may have a thickness greater than that of the third low refractive-index layer.

The first high refractive-index layer and the second high refractive-index layer may have a refractive index of about 1.8 to 2.5, and the first to third low refractive-index layers may have a refractive index of about 1.3 to 1.75.

The first high refractive-index layer and the second high refractive-index layer may have a thickness of about 10 to 100 nm, and the first to third low refractive-index layers may have a thickness of about 5 to 30 nm.

The organic light emitting diode device may include a second substrate opposed to the first substrate.

The organic light emitting diode device may have a space between the capping layer and the second substrate.

The space may be filled with a gas having a refractive index lower than a refractive index of an uppermost layer of the capping layer.

The gas may be air.

The organic light emitting diode device may include a filling member between the capping layer and the second substrate.

The filling member may have a refractive index that matches that of the second substrate.

The at least two low refractive-index layers may have a same refractive index.

The at least one high refractive-index layer may be thicker than either of the at least two low refractive-index layers.

A thickness of a lower refractive-index layer closest to the second electrode is thicker than that of another lower refractive-index layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
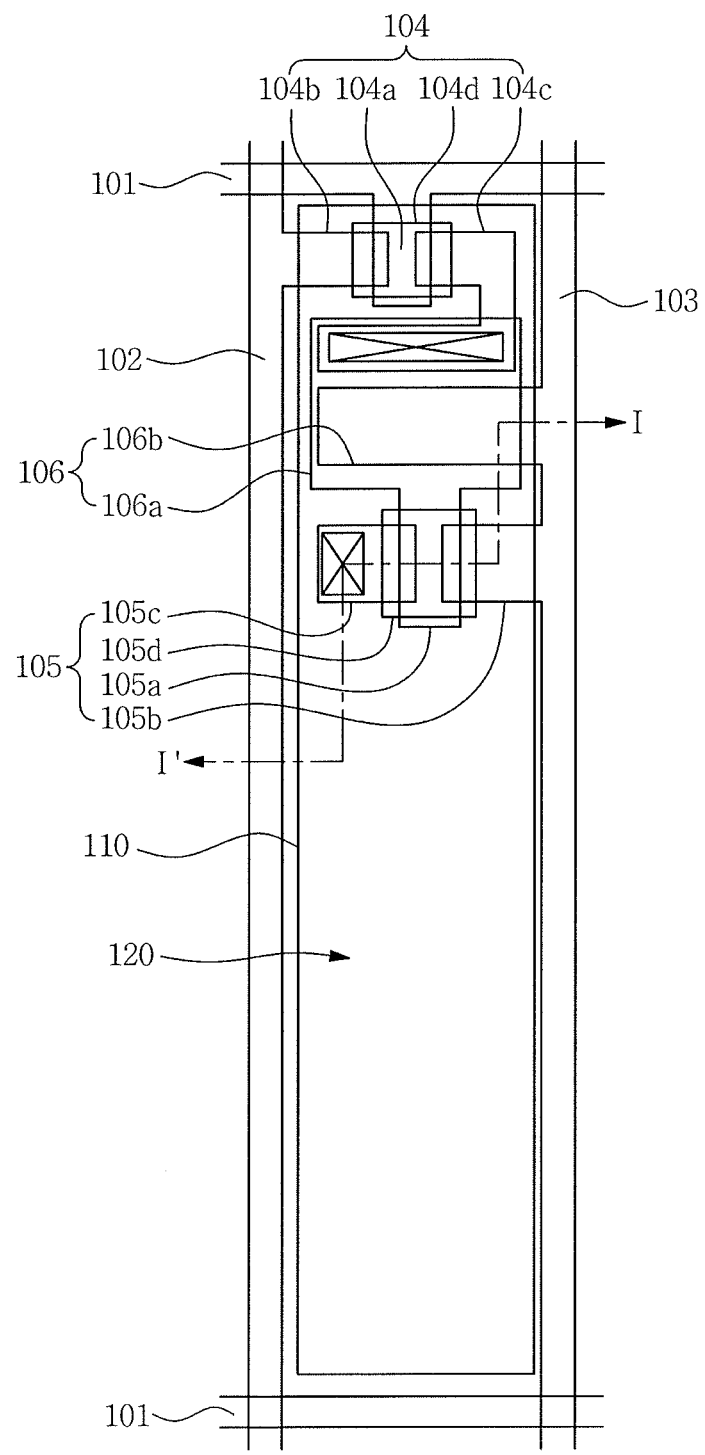
FIG. 1 illustrates a plan view of a pixel of an organic light emitting diode device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

FIG. 1 illustrates a plan view of a pixel of an organic light emitting diode device according to an exemplary embodiment. Referring to FIG. 1, in the organic light emitting diode device according to an exemplary embodiment, a plurality of pixel regions may be defined by a gate line 101 extending along a first direction, a data line 102 insulated from and extending along a second direction to intersect the gate line 101, and a common power line 103. One pixel may be disposed at pixel region. However, embodiments are not limited thereto and the pixel regions may be defined by a pixel defining layer described below, e.g., a plurality of pixels may be disposed at one pixel region.

In addition to a first electrode 110, a second electrode 130 (see FIG. 2), and an organic light emitting layer 120, the pixel of the organic light emitting diode device may have a 2Tr-1Cap structure. For example, the 2Tr-1Cap structure may include two thin film transistors (TFTs) of a switching TFT 104 and a driving TFT 105 and a capacitor (CAP) 106 in each pixel, but embodiments are not limited thereto. For example, the display device may include three or more TFTs and two or more CAPs 106 in one pixel.

The switching TFT 104 may select a pixel to perform light emission. The switching TFT 104 may include a switching gate electrode 104a connected to the gate line 101, a switching source electrode 104b connected to the data line 102, a switching drain electrode 104c connected to a first capacitor plate 106a, and a switching semiconductor layer 104d.

The driving TFT 105 may apply a driving power, which allows an organic light emitting layer 120 in a pixel selected by the switching TFT 104 to emit light. The driving TFT 105 may include a driving gate electrode 105a connected to the first capacitor plate 106a, a driving source electrode 105b connected to the common power line 103, a driving drain electrode 105c connected to the first electrode 110, and a driving semiconductor layer 105d.

The capacitor 106 may include the first capacitor plate 106a and a second capacitor plate 106b. The first capacitor plate 106a may be connected to the switching drain electrode 104c and the driving gate electrode 105a. The second capacitor plate 106b may be connected to the common power line 103. Capacitance of the capacitor 106 may be determined by electric charges stored in the capacitor 106 and a voltage across the pair of capacitor plates 106a and 106b.

A voltage equivalent to a difference between a data voltage transmitted by (or from) the switching TFT 104 and a common voltage supplied from the common power line 103 to the driving TFT 105 may be stored in the capacitor 106, and a current corresponding to the voltage stored in the capacitor 106 may flow to the organic light emitting layer 120 through the driving TFT 105, such that the organic light emitting layer 120 may emit light.

Figure 2:
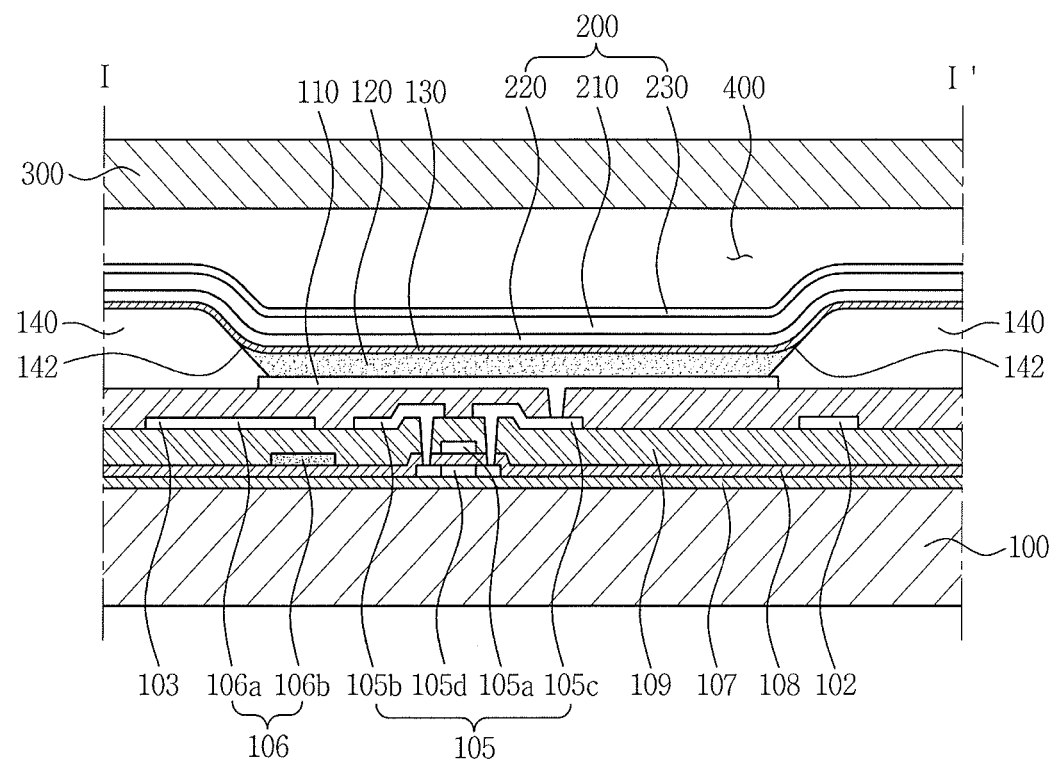
FIG. 2 illustrates a cross-sectional view taken along line I-I' of FIG. 1.

FIG. 2 illustrates a cross-sectional view taken along line I-I' of FIG. 1 according to an exemplary embodiment. Referring to FIG. 2, an organic light emitting diode device according to an exemplary embodiment may include a first substrate 100, the first electrode 110 on the first substrate 100, the organic light emitting layer 120 on the first electrode 110, the second electrode 130 on the organic light emitting layer 120, a capping layer 200 on the second electrode 130, a second substrate 300, and a space 400 between the capping layer 200 and the second substrate 300.

The first substrate 100 may include an insulating substrate including at least one of glass, quartz, ceramic, plastic, and the like. However, embodiments are not limited thereto and the first substrate 100 may include metal materials, e.g., stainless steel and the like.

A buffer layer 107 including an inorganic or organic layer may be disposed on the first substrate 100. The buffer layer 107 may prevent or efficiently reduce infiltration of undesired materials, e.g., moisture or oxygen, and may also planarize a surface of the first substrate 100. A gate insulating layer 108 may be on the first substrate between the gate electrodes 104a and 105a and semiconductor layers 104d and 105d. An interlayer insulating layer 109 may be between the first and second capacitor plates 106a and 106b.

The first electrode 110, the organic light emitting layer 120, and the second electrode 130 may be sequentially stacked, e.g., laminated on the first substrate 100. The first electrode 110 may be an anode injecting holes and the second electrode 130 may be a cathode injecting electrons.

However, embodiments are not limited thereto, and the first electrode 110 may be a cathode and the second electrode 130 may be an anode At least one of a hole injection layer and a hole transporting layer may be between the first electrode 110 and the organic light emitting layer 120. At least one of an electron transporting layer and an electron injection layer may be between the organic light emitting layer 120 and the second electrode 130.

The organic light emitting diode device according to an exemplary embodiment may be provided in a top-emission type device. Accordingly, the first electrode 110 may include a reflective layer and the second electrode 130 may include a transflective layer. However, embodiments are not limited thereto, and the organic light emitting diode device according to an exemplary embodiment may be provided in a bottom-emission type device. In this case, the first electrode 110 may include a transflective layer and the second electrode 130 may include a reflective layer.

The reflective or transflective layers may include one of magnesium (Mg), silver (Ag), gold (Au), calcium (Ca), lithium (Li), chromium (Cr), aluminum (Al), or metal alloys thereof. In this case, whether the layer is a reflective type or a transflective type depends on the thickness. In general, the transflective layer may have a thickness less than 200 nm.

The first electrode 110 may further include a transparent conductive layer and the transparent conductive layer may include transparent conductive oxides (TCO), e.g., indium tin oxide (ITO), indium zinc oxide (IZO), zinc oxide (ZnO), indium oxide ($In_2O_3$), or the like.

The first electrode 110 may have a structure including a reflective layer, a double-layer structure including a reflective layer and a transparent conductive layer, or a triple-layer structure including a transparent conductive layer, a reflective layer, and a transparent conductive layer that are sequentially stacked, e.g., laminated. However, embodiments are not limited thereto, and the first electrode may have a structure including a transparent conductive layer.

The second electrode 130 may include a transparent conductive layer. When the second electrode 130 is formed of a transparent conductive layer, the second electrode 130 may be an anode injecting holes and the first electrode 110 may include a reflective layer serving as a cathode.

The pixel defining layer 140 may have an aperture 142 and the first electrode 110 may be exposed through the aperture 142. In other words, the first electrode 110, the organic light emitting layer 120, and the second electrode 130 may be sequentially stacked, e.g., laminated, within the aperture of the pixel defining layer 140, and the aperture 142 may define a light emission area. Further, the organic light emitting layer 120 and the second electrode 130 may be on the pixel defining layer 140.

The capping layer 200 may be on the second electrode 130 and may include a first high refractive-index layer 210 and first and second low refractive-index layers 220 and 230. The capping layer 200 is to protect the first electrode 110, the organic light emitting layer 120, and the second electrode 130, and to allow light emitted from the organic light emitting layer 120 to be efficiently directed outwards.

The capping layer 200 will be described below in detail with reference to FIG. 4.

The organic light emitting diode device according to an exemplary embodiment may further include a thin film encapsulation layer on the capping layer 200. The thin film encapsulation layer may protect the first electrode 110, the organic light emitting layer 120, the second electrode 130, and the capping layer 200, and may have a structure in which at least one organic layer and at least one inorganic layer are alternately stacked, e.g., laminated.

The second substrate 300 may include the same material as the first substrate 100. A black matrix may be on the second substrate 300.

The black matrix may include metal oxides, e.g., CrO and CrOx, a black resin, or the like. The black matrix may absorb ambient light incident on the black matrix through the second substrate 300 to prevent or efficiently reduce ambient light reflection.

The second substrate 300 may be disposed opposed to the first substrate 100 and may be bonded to the first substrate 100. A sealant may be on the second substrate 300 for the bonding with the first substrate 100.

The space 400 may be filled with a material having a lower refractive index than the capping layer 200, e.g., an upper layer of the capping layer. The material may be a gas, e.g., air.

The organic light emitting diode device according to an exemplary embodiment may be a top-emission type device. Light emitted from the organic light emitting layer 120 may be directed outwards through the second electrode 130, the capping layer 200, space 400, and the second substrate 300.

The light emitted from the organic light emitting layer 120 may pass through an interlayer interface when propagating outwards; in this case, the light may not pass through the interlayer interface and may be reflected at respective interlayer interfaces. For example, light emitted from the organic light emitting layer 120 may pass through an interface between the organic light emitting layer 120 and the second electrode 130, an interface between the second electrode 130 and the capping layer 200, an interface between the capping layer 200 and space 400, and an interface between the space 400 and the second substrate 300, but may be also reflected at one or more of these interfaces.

For example, light may be reflected at the interface between the capping layer 200 and the air layer 400. The reflected light may be rereflected at the interface between the second electrode 130 and the capping layer 200 or may propagate through the second electrode 130 and the organic light emitting layer 120 to be reflected at the interface between the first electrode 110 and the organic light emitting layer 120.

Accordingly, the light may be repeatedly reflected at the interfaces between the respective layers and a plurality of lights may be subject to resonance during the reflection. When the resonance occurs, light may be amplified to bring an increased amount of light emitted outwards. With such resonance effect, light emitted from the organic light emitting layer 120 may be efficiently amplified, such that light efficiency can be improved.

The reflectivity of light perpendicularly incident on an interface between a medium M1 having a refractive index of n1 and a medium M2 having a refractive index of n2 (refer to FIG. 3) can be obtained by the following equation.

$$\text{Reflectivity} = (n2-n1)^2/(n2+n1)^2$$

In the above equation, it can be inferred that although factors determining the reflectivity are sum and difference of the refractive indexes n1 and n2 of each medium, the difference between the refractive indexes n1 and n2 is more important. Accordingly, reflectivity may increase as a difference between the refractive indexes of two media that form an interface increases. Further, possibility of resonance may increase in accordance with an increase in the reflectivity.

Figure 3:
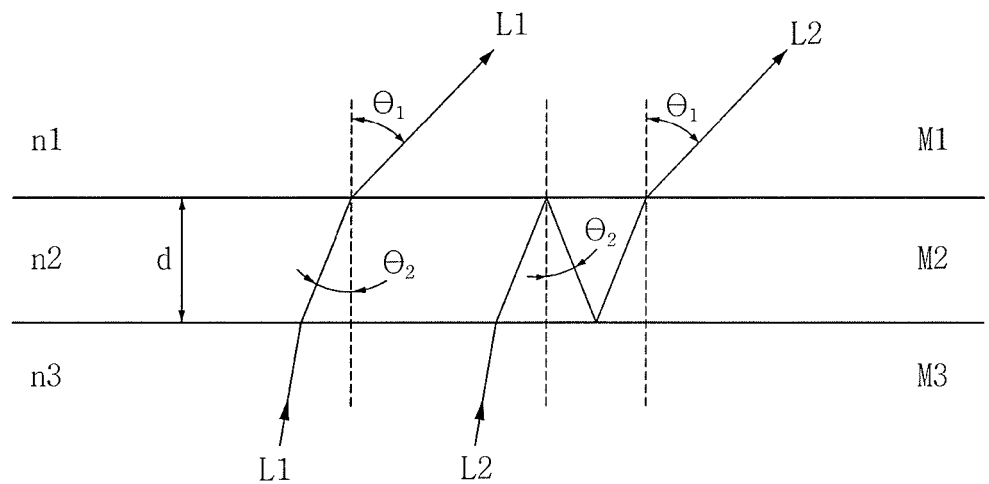
FIG. 3 illustrates a schematic view of a path of light passing through a plurality of layers having different refractive indexes.

Meanwhile, frequent reflections at the interfaces may result in a light-path increase. For example, FIG. 3 illustrates light L1 propagating from the medium M2 toward the medium M1 without any reflection off an interface between the media M1 and M2, and light L2 propagating toward the medium M1 after being reflected at each interface of the medium M2 (i.e., two reflections). When a thickness of the medium M2 is "d" and an incident angle of light incident on the interface between the media M1 and M2 is "θ2," a light path of the light L2 incident on the medium M1 after being reflected off each interface of the medium M2 (i.e., two reflections) has a path difference of "2d/cos θ2" compared to a light path of the light L1 incident on the medium M1 without any reflection within the medium M2. When light incident on the medium M2 is reflected four times within the medium M2 and then incident on the medium M1, a path difference becomes "4d/cos θ2." Accordingly, as the number of times light is reflected increases, the path difference may be increased. Further, when the refractive index n1 of the medium M1 is less than the refractive index n2 of the medium M2, an incident angle θ1 at which light is incident on the medium M1 may become greater than the angle θ2.

Due to such path differences, white angular dependency (WAD) may become prominent. The WAD refers to a phenomenon where a color of light appears differently when viewed from the front side and when viewed from the lateral side. For example, when an organic light emitting diode device emits white light, white light may be observed from the front side but light of other colors, such as blue, may be observed from the lateral side duet to wavelength shift. Smaller light path differences, i.e., smaller refractive-index differences at interfaces, between light emitted from the organic light emitting diode device may improve WAD. Accordingly, light extraction efficiency associated with resonance and WAD may be in a complementary relationship with each other.

Figure 4:
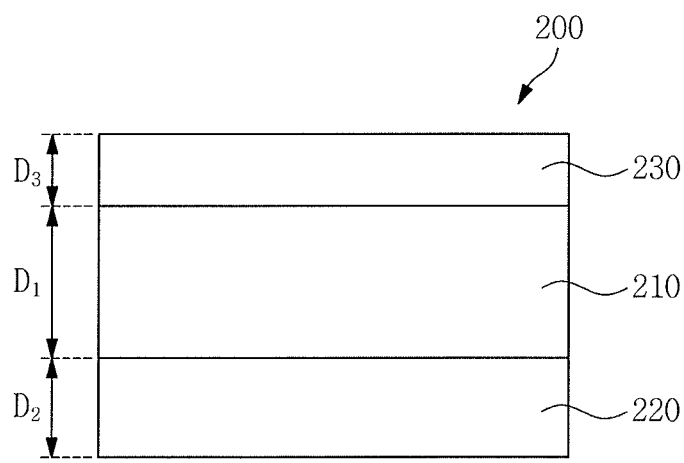
FIG. 4 illustrates a schematic view of a configuration of a capping layer of FIG. 2.

FIG. 4 illustrates a schematic view of a configuration of the capping layer 200 of FIG. 2. Referring to FIG. 4, the capping layer 200 may have a triple-layer structure including a first high refractive-index layer 210, a first low refractive-index layer 220, and a second low refractive-index layer 230. Further, the first low refractive-index layer 220, the first high refractive-index layer 210, and the second low refractive-index layer 230 may be sequentially stacked, e.g., laminated, in the capping layer 200.

The first high refractive-index layer 210 may have a refractive index of about 1.8 to 2.5. The first high refractive-index layer 210 may include at least one material of inorganic materials and organic materials. Accordingly, the first high refractive-index layer 210 may include an inorganic layer, an organic layer, or an organic layer including inorganic particles.

Inorganic materials that can be used in the first high refractive-index layer 210 may include, e.g., zinc oxides, titanium oxides, zirconium oxides, niobium oxides, tantalum oxides, tin oxides, nickel oxides, silicon nitrides, indium nitrides, gallium nitrides, and the like.

Organic materials that can be used in the first high refractive-index layer 210 may include, e.g., poly(3,4-ethylenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris[N,N-bis(2-methylphenyl)amino]-benzene (o-MTDAB), 1,3,5-tris[N,N-bis(3-methylphenyl)amino]benzene (m-MTDAB), 1,3,5-tris[N,N-bis(4-methylphenyl) amino]benzene (p-MTDAB), 4,4'-bis[N,N-bis(3-methylphenyl)-amino]diphenylmethane (BPPM), 4,4'-dicarbazolyl-1,1'-biphenyl (CBP), 4,4',4"-tris(N-carbazole) triphenyl amine (TCTA), 2,2',2"-(1,3,5-benzene-tolyl)tris-[1-phenyl-1H-benzoimidazol] (TPBI), 3-(4-biphenylyl)-4-phenyl-5-t-butylphenyl-1,2,4-triazole (TAZ), and the like.

The first and second low refractive-index layers 220 and 230 may have refractive indexes of about 1.3 to 1.75. The first and second low refractive-index layers 220 and 230 may include at least one material of inorganic materials and organic materials. Accordingly, the first low refractive-index layer 220 and the second low refractive-index layer 230 may include an inorganic layer, an organic layer, or an organic layer including inorganic particles.

Inorganic materials that can be used in the first and second low refractive-index layers 220 and 230 may include, e.g., silicon oxides, magnesium fluorides, and the like.

Organic materials that can be used in the first and second low refractive-index layers 220 and 230 may include, e.g., acrylic, polyimide, polyamide, alq3[Tris(8-hydroxyquinolinato)aluminum], and the like.

Inorganic materials or organic materials that can be used in the first high refractive-index layer 210 and the first and second low refractive-index layers 220 and 230 according to an exemplary embodiment may not be limited to the above-description, and any suitable materials known to those skilled in the art can be utilized.

The first high refractive-index layer 210 may have a thickness of about 10 to 100 nm. The first and second low refractive-index layers 220 and 230 may have thicknesses of about 5 to 30 nm, and the first and second low refractive-index layers 220 and 230 may have thicknesses different from each other.

For example, a thickness D1 of the first high refractive-index layer 210 may be greater than a thickness D2 of the first low refractive-index layer 220 and a thickness D3 of the second low refractive-index layer 230. Further, the thickness D2 of the first low refractive-index layer 220 may be greater than the thickness D3 of the second low refractive-index layer 230.

The capping layer 200 may have a multi-layer structure in which each layer has a different refractive index. Further, the capping layer 200 may have a non-symmetric structure in which the first low refractive-index layer 220 and the second low refractive-index layer 230 have thicknesses different from each other with the first high refractive-index layer 210 interposed therebetween. Accordingly, the display device including the capping layer 200 may be improved in light extraction efficiency and also improved in WAD.

In particular, in the capping layer 200, the first low refractive-index layer 220 under the first high refractive-index layer 210 may have a thickness greater than that of the second low refractive-index layer 230 on the first high refractive-index layer 210. Accordingly, the display device including the capping layer 200 may improve both light extraction efficiency and WAD.

Figure 5:
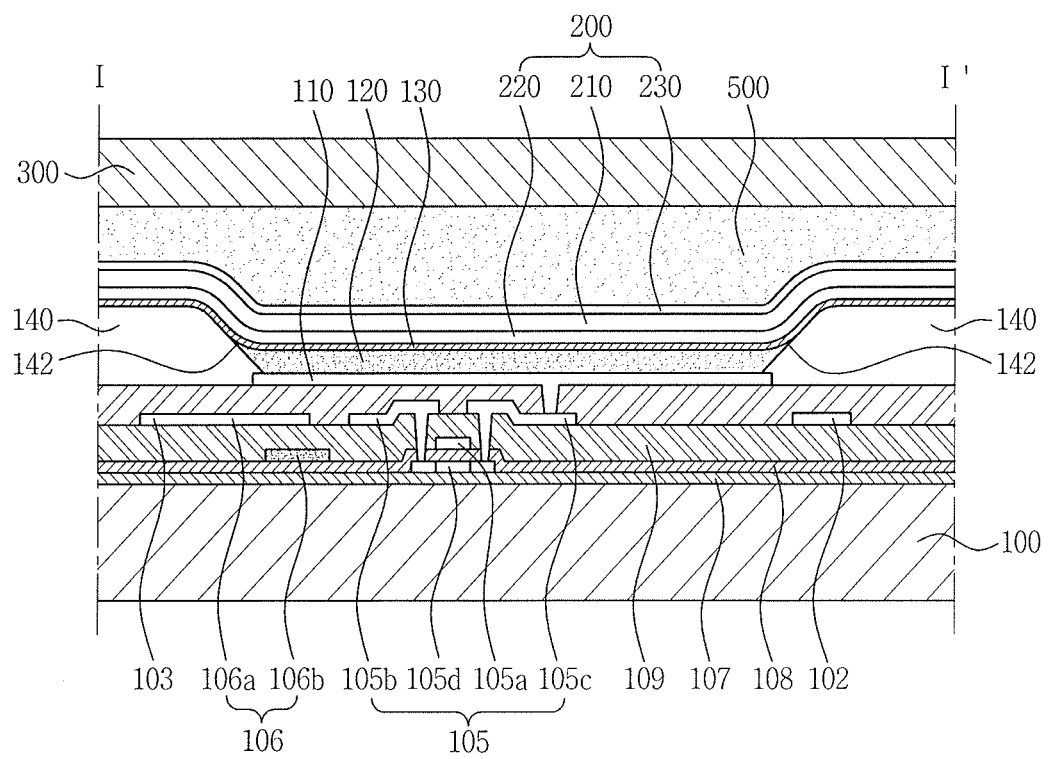
FIG. 5 illustrates a cross-sectional view taken along line I-I' of FIG. 1 according to another exemplary embodiment.

FIG. 5 illustrates a cross-sectional view taken along line I-I' of FIG. 1 according to another exemplary embodiment. Referring to FIG. 5, the organic light emitting diode device according to another exemplary embodiment is identical to the organic light emitting diode device of FIG. 2 except for a filling member 500, and the description thereof will not be repeated for conciseness.

The filling member 500 may be in the space 400 between the capping layer 200 and the second substrate 300. The filling member 500 may improve device strength and durability of the organic light emitting diode device.

The filling member 500 may include polymers that may incorporate organic materials. The filling member 500 may have a refractive index greater than or less than that of the second low refractive-index layer 230 of the capping layer 200. However, embodiments are not limited thereto, and the filling member 500 may have the same refractive index as the second low refractive-index layer 230. Accordingly, materials of the filling member 500 may be selected considering a refractive index of the second low refractive-index layer 230 of the capping layer 200.

Further, the material of the filling member 500 may be selected considering a refractive index of the second substrate 300, i.e., may be selected to match that of the second substrate. For example, when a glass substrate having a refractive index of 1.5 is used as the second substrate 300, poly (methyl methacrylate) (PMMA) having a refractive index of 1.5 may be used as the filling member 500.

Figure 6:
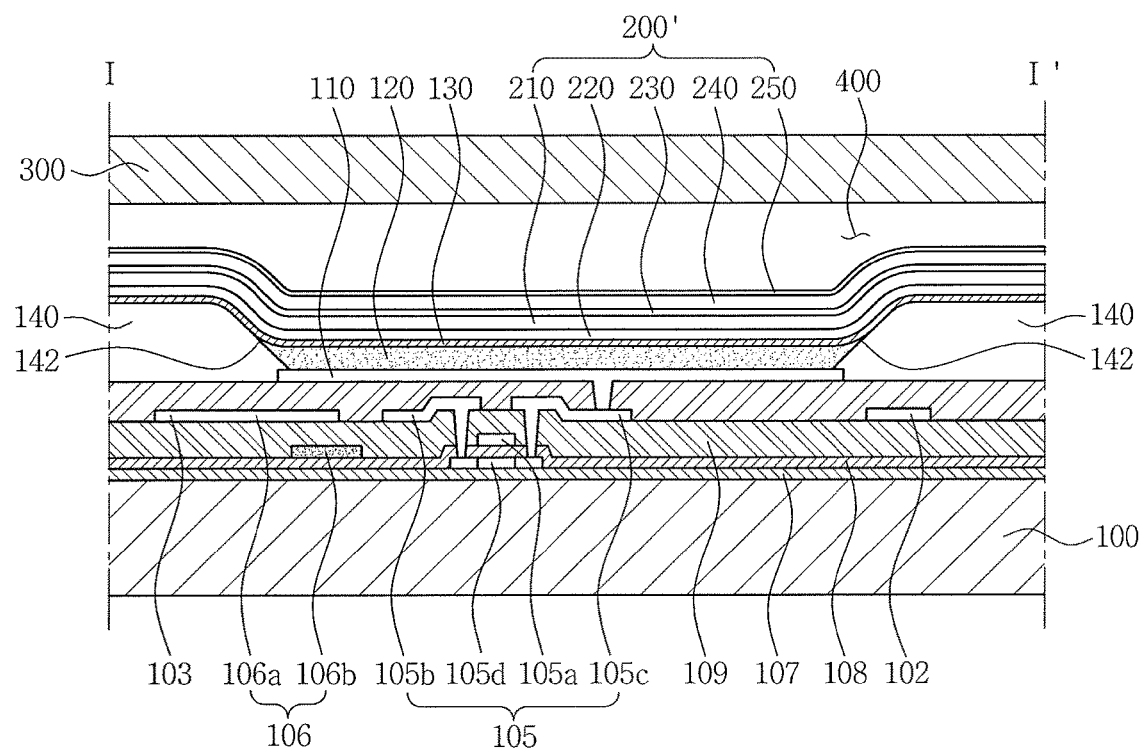
FIG. 6 illustrates a cross-sectional view taken along line I-I' of FIG. 1 according to yet another exemplary embodiment.
Figure 7:
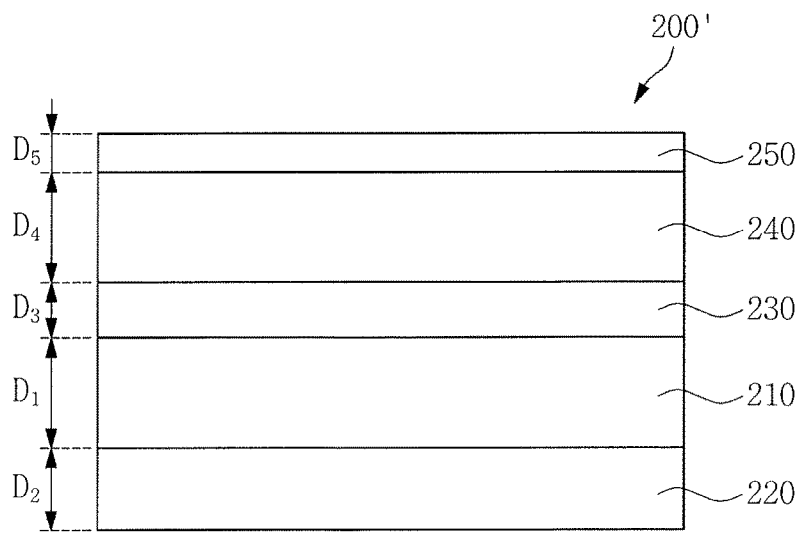
FIG. 7 illustrates a schematic view of a configuration of a capping layer of FIG. 6.

FIG. 6 illustrates a cross-sectional view taken along line I-I' of FIG. 1 according to yet another exemplary embodiment. FIG. 7 is a schematic view illustrating a configuration of a capping layer of FIG. 6.

Referring to FIGS. 6 and 7, an organic light emitting diode device according to another exemplary embodiment is identical to the organic light emitting diode device illustrated in FIG. 2, except for a capping layer 200'. Thus, the description thereof will not be repeated for conciseness.

The capping layer 200 may have a quintuple-layer structure including the first high refractive-index layer 210, a second high refractive-index layer 240, the first low refractive-index layer 220, the second low refractive-index layer 230, and a third low refractive-index layer 250. Further, the first low refractive-index layer 220, the first high refractive-index layer 210, the second low refractive-index layer 230, the second high refractive-index layer 240, and the third low refractive-index layer 250 may be sequentially stacked, e.g., laminated, in the capping layer 200 in the order listed.

A thickness D1 of the first high refractive-index layer 210 may be greater than a thickness D2 of the first low refractive-index layer 220, a thickness D3 of the second low refractive-index layer 230, and a thickness D5 of the third low refractive-index layer 250. Further, a thickness D4 of the second high refractive-index layer 240 may be greater than the thickness D2 of the first low refractive-index layer 220, the thickness D3 of the second low refractive-index layer 230, and the thickness D5 of the third low refractive-index layer 250. The thickness D1 of the first high refractive-index layer 210 may be greater than the thickness D4 of the second high refractive-index layer 240. However, embodiments are not limited thereto, and the first and second high refractive-index layers 210 and 240 may have the same thickness.

The thickness D2 of the first low refractive-index layer 220 may be greater than the thickness D3 of the second low refractive-index layer 230 and the thickness D5 of the third low refractive-index layer 250. Further, the thickness D3 of the second low refractive-index layer 230 may be greater than the thickness D5 of the third low refractive-index layer 250.

Figure 8:
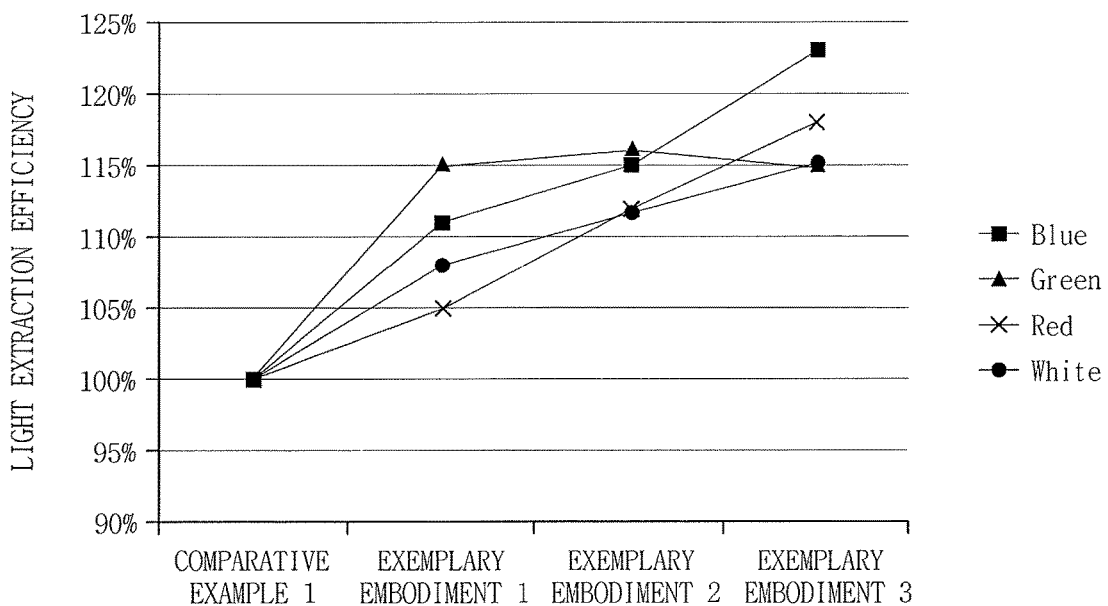
FIG. 8 illustrates a graph of light extraction efficiency of display devices according to Comparative Example 1 and Exemplary Embodiments 1 to 3.
Figure 9:
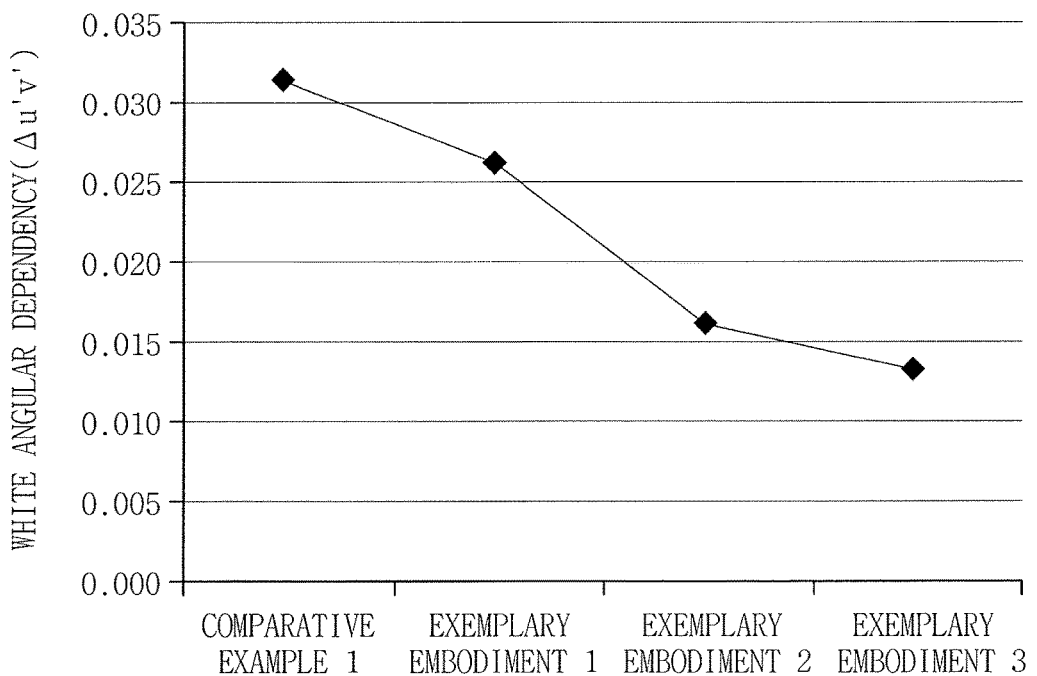
FIG. 9 illustrates a graph of white angular dependency of the display devices according to Comparative Example 1 and Exemplary Embodiments 1 to 3.

FIG. 8 illustrates a graph of light extraction efficiency of display devices according to Comparative Example 1 and Exemplary Embodiments 1 to 3. FIG. 9 illustrates a graph of WAD of the display devices according to Comparative Example 1 and Exemplary Embodiments 1 to 3.

A capping layer according to Comparative Example 1 has a single-layer structure and may have a refractive index of about 1.98 and a thickness of about 85 nm.

Capping layers of Exemplary Embodiments 1 to 3 have a triple-layer structure in which a first low refractive-index layer, a first high refractive-index layer, and a second low refractive-index layer are sequentially stacked. The capping layer of Exemplary Embodiment 1 includes a first low refractive-index layer having a refractive index of about 1.61 and a thickness of about 15 nm, a first high refractive-index layer having a refractive index of about 1.98 and a thickness of about 65 nm, and a second low refractive-index layer having a refractive index of about 1.61 and a thickness of about 10 nm. The capping layer of Exemplary Embodiment 2 includes a first low refractive-index layer having a refractive index of about 1.61 and a thickness of about 20 nm, a first high refractive-index layer having a refractive index of about 1.98 and a thickness of about 60 nm, and a second low refractive-index layer having a refractive index of about 1.61 and a thickness of about 10 nm. The capping layer of the Exemplary Embodiment 3 includes a first low refractive-index layer having a refractive index of about 1.61 and a thickness of about 25 nm, a first high refractive-index layer having a refractive index of about 1.98 and a thickness of about 55 nm, and a second low refractive-index layer having a refractive index of about 1.61 and a thickness of about 10 nm.

Referring to FIG. 8, Exemplary Embodiment 1, compared to Comparative Example 1, may be improved in light extraction efficiency by minimum 5% to maximum 15%. Exemplary Embodiment 2, compared to Comparative Example 1, may be improved in light extraction efficiency by minimum 12% to maximum 16%. Exemplary Embodiment 3, compared to Comparative Example 1, may be improved in light extraction efficiency by minimum 15% to maximum 23%.

Referring to FIG. 9, Comparative Example 1 shows WAD of about 0.032, but Exemplary Embodiments 1 to 3 show WAD of about 0.026, 0.016, and 0.013, respectively, showing improvement on WAD compared to Comparative Example 1.

Embodiments are directed to a display device improved in light efficiency and color distortion phenomenon, in particular to designing a capping layer to be used in the display device to provide one or more of these features.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode device comprising:
a first substrate;
a first electrode on the first substrate;
an organic light emitting layer on the first electrode;
a second electrode on the organic light emitting layer; and
a capping layer on the second electrode; the capping layer including a first high refractive-index layer, a first low refractive-index layer, and a second low refractive-index layer, wherein
the first high refractive-index layer has a thickness greater than the first low refractive-index layer, and
the first low refractive-index layer has a thickness greater than the second low refractive-index layer, wherein the first high refractive-index layer has a refractive index of about 1.8 to 2.5.

2. The organic light emitting diode device as claimed in claim 1, wherein the first low refractive-index layer, the first high refractive-index layer, and the second low refractive-index layer are sequentially stacked on the second electrode.

3. The organic light emitting diode device as claimed in claim 1, wherein
the first low refractive-index layer and the second low refractive-index layer have a refractive index of about 1.3 to 1.75.

4. The organic light emitting diode device as claimed in claim 1, wherein:
the first high refractive-index layer has a thickness of about 10 to 100 nm, and
the first low refractive-index layer and the second low refractive-index layer have a thickness of about 5 to 30 nm.

5. The organic light emitting diode device as claimed in claim 1, wherein the capping layer includes a second high refractive-index layer and a third low refractive-index layer.

6. The organic light emitting diode device as claimed in claim 5, wherein the first low refractive-index layer, the first high refractive-index layer, the second low refractive-index layer, the second high refractive-index layer, and the third low refractive-index layer are sequentially stacked on the second electrode.

7. The organic light emitting diode device as claimed in claim 6, wherein:
the first low refractive-index layer has a thickness greater than those of the second low refractive-index layer and the third low refractive-index layer, and
the second low refractive-index layer has a thickness greater than that of the third low refractive-index layer.

8. The organic light emitting diode device as claimed in claim 5, wherein:
the first high refractive-index layer and the second high refractive-index layer have a refractive index of about 1.8 to 2.5, and
the first to third low refractive-index layers have a refractive index of about 1.3 to 1.75.

9. The organic light emitting diode device as claimed in claim 5, wherein:
the first high refractive-index layer and the second high refractive-index layer have a thickness of about 10 to 100 nm, and
the first to third low refractive-index layers have a thickness of about 5 to 30 nm.

10. The organic light emitting diode device as claimed in claim 1, further comprising a second substrate opposed to the first substrate.

11. The organic light emitting diode device as claimed in claim 10, further having a space between the capping layer and the second substrate.

12. The organic light emitting diode device as claimed in claim 11, wherein the space is filled with a gas having a refractive index lower than a refractive index of an uppermost layer of the capping layer.

13. The organic light emitting diode device as claimed in claim 12, wherein the gas is air.

14. The organic light emitting diode device as claimed in claim 10, further comprising a filling member between the capping layer and the second substrate.

15. The organic light emitting diode device as claimed in claim 14, wherein the filling member has a refractive index that matches that of the second substrate.

16. The organic light emitting diode device as claimed in claim 1, wherein the first and second low refractive-index layers have a same refractive index.

17. The organic light emitting diode device as claimed in claim 1, wherein the first high refractive-index layer is thicker than either of the first and second low refractive-index layers.

* * * * *